(12) United States Patent
Guan et al.

(10) Patent No.: US 11,620,957 B2
(45) Date of Patent: Apr. 4, 2023

(54) BACKLIGHT DRIVE SYSTEM, DISPLAY DEVICE AND BACKLIGHT DRIVE BOARD

(71) Applicant: BOE TECHNOLOGY GROUP CO., LTD., Beijing (CN)

(72) Inventors: Enhui Guan, Beijing (CN); Zhimao Wang, Beijing (CN); Xiao Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 17/425,473

(22) PCT Filed: Feb. 1, 2021

(86) PCT No.: PCT/CN2021/074699
§ 371 (c)(1),
(2) Date: Jul. 23, 2021

(87) PCT Pub. No.: WO2021/169739
PCT Pub. Date: Sep. 2, 2021

(65) Prior Publication Data
US 2022/0319442 A1    Oct. 6, 2022

(30) Foreign Application Priority Data

Feb. 24, 2020 (CN) .......................... 202020204080.3

(51) Int. Cl.
*G09G 3/34* (2006.01)
*H05K 7/20* (2006.01)

(52) U.S. Cl.
CPC ......... *G09G 3/342* (2013.01); *H05K 7/20963* (2013.01); *G09G 2320/0233* (2013.01); *G09G 2330/02* (2013.01); *G09G 2330/045* (2013.01)

(58) Field of Classification Search
None
See application file for complete search history.

(56) References Cited

U.S. PATENT DOCUMENTS

2004/0252254 A1* 12/2004 Koo ................... G02F 1/133308
349/58
2006/0146565 A1* 7/2006 Lee ....................... G02B 6/0016
362/558
(Continued)

FOREIGN PATENT DOCUMENTS

CN          105027185 A       11/2015
CN          109637477 A        4/2019
(Continued)

*Primary Examiner* — Matthew Yeung
(74) *Attorney, Agent, or Firm* — WHDA, LLP (57) ABSTRACT

A backlight drive system, a display device and a backlight drive board, relates to the field of display technology. The backlight drive system is used for the display device, the display device comprises a display screen (20) and a plurality of backlight units, the backlight drive system comprises: a control board (10) and a plurality of backlight drive boards (11) electrically connected to the control board (10), the plurality of backlight drive boards (11) are disposed at the edge of display screen (20), the plurality of backlight drive boards (11) electrically connected to the plurality of backlight units by a backlight drive cable (111); the control board (10) is configured to output enabling control signal and brightness adjustment signal to the plurality of backlight drive board (11), to control the plurality of backlight drive boards (11) to drive the plurality of backlight units, to achieve enabling control and brightness adjustment.

18 Claims, 2 Drawing Sheets

(56) References Cited

U.S. PATENT DOCUMENTS

| | | | |
|---|---|---|---|
| 2009/0051293 | A1 | 2/2009 | Houdek et al. |
| 2012/0063133 | A1* | 3/2012 | Takeuchi .......... G02F 1/133603 |
| | | | 362/296.01 |
| 2012/0182763 | A1* | 7/2012 | Masuji .............. G02F 1/133615 |
| | | | 29/428 |
| 2014/0313116 | A1* | 10/2014 | Jang ................. G02F 1/133308 |
| | | | 362/97.1 |

FOREIGN PATENT DOCUMENTS

| | | |
|---|---|---|
| CN | 110111745 A | 8/2019 |
| CN | 209692916 U | 11/2019 |
| CN | 209928945 U | 1/2020 |
| CN | 210865585 U | 6/2020 |

\* cited by examiner

BACKLIGHT DRIVE SYSTEM, DISPLAY DEVICE AND BACKLIGHT DRIVE BOARD

CROSS REFERENCE TO RELEVANT DISCLOSURES

The disclosure claims priority to Chinese Patent Disclosure No. 202020204080.3, entitled "Backlight Drive System, Display Device and Backlight drive board", filed with the China National Intellectual Property Administration on Feb. 24, 2020, which is incorporated herein by reference in its entirety.

TECHNICAL FIELD

The disclosure relates to the technical field of display and, more particularly, to a backlight drive system, display device and backlight drive board.

BACKGROUND

With the development of display technology, the requirements of user for the display device are getting increasingly high. Accordingly, the requirements of user for the performance of the backlight drive system on the display device are also getting increasingly high.

In the related technology, a backlight drive system usually obtains a backlight drive board, which is usually disposed in the partial central position of the display screen. The backlight drive board is electrically connected to the backlight unit disposed at the edge or back of the display screen by using the backlight drive cable to achieve the enabling control and brightness adjustment of the backlight unit.

SUMMARY

The present disclosure provides a backlight drive system, a display device and a backlight drive board.

In a first aspect, an embodiment of the present disclosure provides a backlight drive system, which is applied to a display device, and the display device comprises a display screen and a plurality of backlight units, wherein the backlight drive system includes:

a control board, wherein the control board and a plurality of backlight drive boards electrically connected to the control board, the plurality of backlight drive boards are disposed at the edge of the display screen, and the plurality of backlight drive boards are electrically connected to the plurality of back units; and the control board is configured to output enabling control signals and brightness adjustment signals to the plurality of backlight driving boards, to control the plurality of backlight driving boards to drive the plurality of backlight units, to achieve enabling control and brightness adjustment.

Optionally, wherein the backlight drive system further includes: a plurality of power supply boards, each of the plurality of power supply boards is electrically connected to at least one of the plurality of back drive boards adjacent to the location by using a power cable in order to supply power to the backlight drive boards, and each of the plurality of the backlight driving boards is electrically connected to one of the plurality of the power supply boards.

Optionally, wherein the backlight drive system further includes: a transfer power board, and the transfer power board is electrically connected to each of the plurality of power boards in order to access voltage signal to power control to the plurality of power supply boards.

Optionally, wherein the control board is electrically connected to each of the plurality of backlight drive boards by using an enabling signal cable and a brightness signal cable, the enabling signal cable is configured to transmit enabling control signal, and the brightness signal cable is configured to transmit brightness adjustment signal;

wherein the control board is connected to the plurality of backlight drive boards with equal length of the enabling signal cable and the brightness signal cable.

Optionally, wherein the control board is electrically connected to one of the plurality of power supply boards, in case that the control board receives power input of the power supply board, output the enabling control signal and the brightness adjustment signal; and the backlight drive board is started in the case of receiving the power supply input, the enabling control signal and the brightness adjustment signal.

Optionally, wherein the plurality of backlight drive boards are disposed on both sides of the display screen, the plurality of power supply boards are disposed on both sides of the display screen, and respectively electrically connected to the backlight drive board, the control board is disposed in the central area of the display screen.

Optionally, wherein the backlight drive system includes 4 of the backlight drive boards and 2 of the power supply boards; wherein, 4 of the backlight drive boards are respectively disposed close to 4 top corners of the display screen; and each one of the power supply boards are electrically connected to 2 of the backlight drive boards respectively adjacent to its position.

Optionally, wherein the backlight drive board is provided with a power source interface, a control interface and a backlight interface.

Optionally, wherein the control board is Field Programmable Gate Array.

Optionally, wherein the display device comprises a plurality of display screens, each of the plurality of display screens is disposed a plurality of backlight drive boards at the edge, and the control board of the backlight drive system is connected to the plurality of backlight drive board of each of the plurality of display screens.

Optionally, wherein to start the backlight drive board, the power supply board is controlled to output power to the control board and the backlight drive board connected to the power supply board at the same time, the control board may output the enabling control signal and the brightness adjustment signal to the backlight drive board only in the case of receiving input power of the power supply board, each of the backlight drive boards may start only in the case of receiving the input power of the power supply board, the enabling control signal and the brightness adjustment signal of the control board.

In a second aspect, an embodiment of the present disclosure provides a backlight device, wherein the display device includes: a display screen, a plurality of backlight units and the backlight drive system according to the first aspect; wherein, the plurality of backlight drive boards of the backlight drive system are disposed respectively at the edge of the display screen; and the plurality of backlight drive boards are electrically connected to the plurality of backlight units by the backlight drive cable.

In a third aspect, an embodiment of the present disclosure provides a backlight drive board of the above-mentioned backlight drive system, wherein the backlight drive board includes: a substrate and a plurality of heating components, the plurality of heating components are disposed on the substrate, the substrate is provided with a heat dissipating layer in a position relative to the heating components, the heating components are disposed in a straight cable and the plurality of heat dissipating layer are connected as an entirety.

Optionally, wherein the substrate is provided with a first side and an opposite second side, the plurality of heat components are disposed on the first side; and the first side is provided with a first aperture, to expose the part of heat dissipating layer opposite to the first aperture.

Optionally, wherein the second side is provided with a second aperture, to expose the part of heat dissipating layer opposite to the second aperture.

Optionally, wherein the heat component includes at least one of the followings: a field displacement effect transistor, a diode and an inductor.

Optionally, wherein the substrate is provided with at least two layers of ground layers.

The foregoing illustration is only an overview of a technical solution of the present disclosure. A technical means of the present disclosure may be more fully practiced in accordance with the description; and the above and other objects, features and advantages of the present invention will be more clearly understood from the following detailed description.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Detailed description of the present disclosure will further be made with reference to drawings and embodiments in order to make the above objectives, features and advantages of the present disclosure more apparent and lucid. Apparently, the described embodiments are some but not all of the embodiments of the present disclosure. All other embodiments obtained by persons of ordinary skill in the art based on the embodiments of the present disclosure without creative efforts shall fall within the protection scope of the present disclosure.

An embodiment of the present disclosure provides a backlight drive system, the backlight drive system may be used for a display device, the display device may include a display screen and a plurality of backlight units, and the backlight drive system may be configured to achieve enabling control and brightness adjustment.

Figure 1:
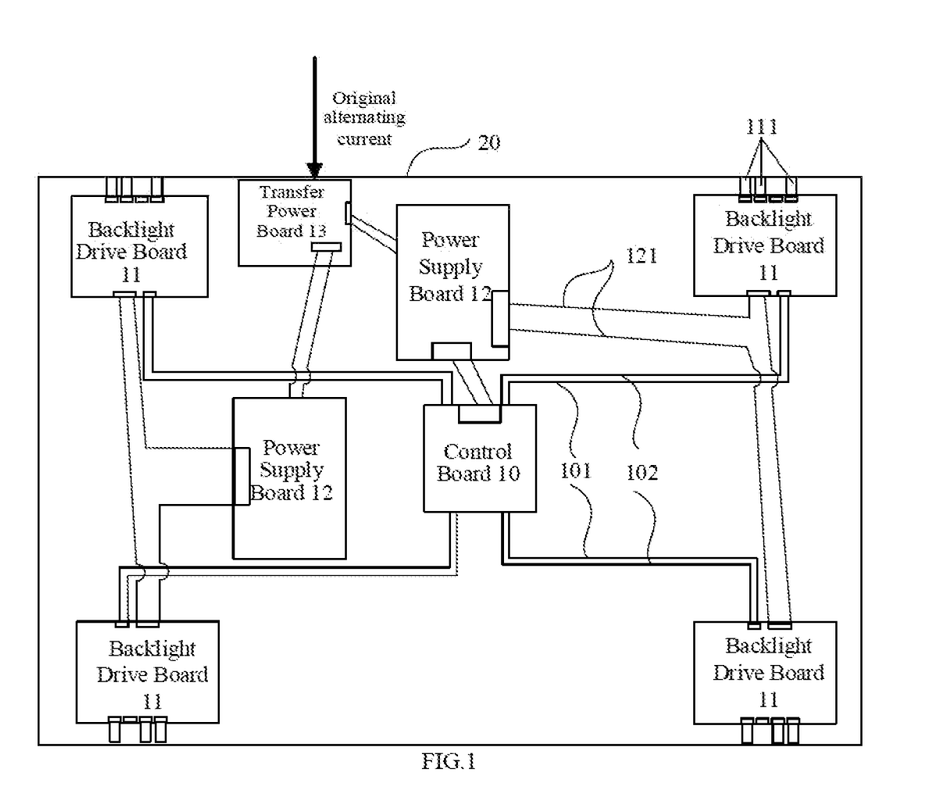
FIG. 1 illustrates a schematic diagram of a backlight drive system according to an embodiment of the present disclosure.

FIG. 1 illustrates a schematic diagram of a backlight drive system according to an embodiment of the present disclosure. As shown in FIG. 1, the backlight system may include: a control board 10 and a plurality of back drive boards 11 which electrically connected to the control board 10, a plurality of backlight drive boards 11 are disposed at the edge of the display screen 20, the backlight drive board card 11 is electrically connected to a backlight unit (not shown in the FIGS.) by using a backlight drive cable 111. Specifically, the control board 10 may be configured to control the backlight drive board 11 to drive the plurality of backlight units by the backlight drive board 11: the control board 10 may be configured to output the enabling control signal and brightness adjustment signal to the backlight drive board 11 to control the backlight drive board 11 to drive the plurality of backlight units to achieve enabling control and brightness adjustment.

In practical application, the backlight drive board 11 is usually disposed on the front of display screen 20 and the backlight unit is usually disposed on the edge or the back of the screen. Therefore, the backlight drive cable 111 on the backlight drive board 11 on the front of the display screen 20 usually needs to flip over the edge of the display screen 20 to electrically connect to the backlight unit on the back of the display screen 20 to achieve the enabling control and brightness adjustment of the backlight unit. Specifically, the backlight unit may be a backlight lamp. The enabling control may at least include the turning-on and turning-off control of the backlight unit, and the brightness adjustment control may at least include the light and shade adjustment of the backlight unit.

In an embodiment of the present disclosure, since the backlight drive system includes a plurality of backlight drive board 11, the plurality of backlight drive board 11 are disposed at the edge of a display screen 20, the backlight unit is usually disposed on the edge or the back of the display screen 20, so that the distance between the backlight drive board 11 and the backlight unit is short. In this way, the length of backlight drive cable 111 between backlight drive board 11 and the backlight unit may be shortened, the electromagnetic interference caused by the backlight drive cable 111 during signal transmission may be reduced, and the stability of the backlight drive system may be improved. Moreover, in the backlight drive system, the enabling control and brightness adjustment of a plurality of backlight units may be achieved by using a plurality of backlight drive board 11, and the coordinated switching between the plurality of backlight drive board 11 may improve the display uniformity of the plurality of backlight units, and the electronic components on a single backlight drive board 11 may be reduced, and the heat dissipating effect is improved. Furthermore, the heat dissipating effect of the backlight drive system may be improved.

In practical application, the display device may also include a plurality of display screens 20, the edge of each display screen 20 is provided with a plurality of backlight drive board 11, the control board 10 in the backlight drive system is connected to the backlight drive board 11 on each display screen 20 to achieve the backlight control of the plurality of display screens 20 in the display device. FIG. 1 only shows that the display device includes a display screen 20, if the display device includes a plurality of display screens 20, it may be performed by referring to FIG. 1 and will not be repeated here.

It may be understood that FIG. 1 only shows the case of that the backlight drive system includes four backlight drive boards 11, and the four backlight drive boards 11 are respectively close to four top vertex corners of a display screen 20. In practical application, a skilled person in the art may set the number of backlight drive board 11 according to the actual needs, for example, the number of backlight drive boards 11 may be three, six or eight, etc. The specific number of backlight drive boards 11 is not limited in the embodiment of the present disclosure.

For example, as shown in FIG. 1, four backlight drive boards 11 may be used in the backlight drive system to control the backlight unit. The four backlight drive boards 11 may be disposed at the position close to the edges of vertex corners of the display screen 20. Specifically, the backlight drive board 11 may be provided with a backlight drive cable 111 for electrically connecting to the backlight unit. The specific position of the backlight drive cable 111 may be disposed according to the actual situation. For example, in order to be as close as possible to the backlight unit, the backlight drive cable 111 may be disposed at the upper, lower, left, or right end of the backlight drive board 11, and the specific position of a backlight drive cable 111 on a backlight drive board 11 is not limited in the embodiment of the present disclosure.

In practical application, each backlight drive board 11 may be configured to drive 12 backlight units. Thus, in case that the backlight drive system includes four backlight drive boards 11, the backlight drive system may be configured to drive forty-eight backlight units. Compared to the prior art, a backlight drive board is configured to drive forty-eight backlight units, the backlight drive system in the embodiment of the present disclosure, the number of electronic components on the backlight drive board 11 is fewer and the heat dissipating effect is better. Furthermore, the heat dissipating effect of the backlight drive system may be better.

Also, due to the backlight drive board 11 has fewer backlight units to drive, the number of inductors on the backlight drive board 11 is fewer, thus, it may reduce the resonance of the backlight drive board 11, furthermore, it may reduce the noise when the backlight drive board 11 is running.

In practical application, due to a plurality of backlight drive boards 11 may be configured to enable control and brightness adjustment of a plurality of backlight units, a backlight drive board 11 is usually disposed with a backlight drive chip, a peripheral circuit, a clock circuit and a corresponding control circuit to achieve the automatic switch of multi-channel in the backlight drive circuit, therefore, through the coordinated switch between a plurality of backlight drive boards 11, the display uniformity of the plurality of backlight units may be improved.

For example, in the backlight drive system as shown in FIG. 1, when the brightness of the backlight unit controlled by the backlight drive board 11 in the upper left corner is shade, it may switch and coordinate with other backlight drive boards 11 to control the backlight unit, so that the brightnesses of all the backlight units in the display device are relatively uniformed, so that the display effect of the display device is improved.

In an embodiment of the present disclosure, the backlight drive system may also include a power source component. The power source component supplies power to a control board 10 and a plurality of backlight drive boards 11, respectively. The power source component may include a plurality of power supply boards 12. The power supply board 12 may be configured to supply power to a control board 10 and a backlight drive board 11. The power supply board 12 may also include a transfer power board 13, the power transfer board 13 may be configured to transfer external power supply to the power supply board 12.

Specifically, the backlight drive system may also include a plurality of power supply board 12, each power supply board 12 is electrically connected to at least one adjacent backlight drive board 11 by using a power cable 121, which is configured to supply power to the backlight drive board 11. Each backlight drive board 11 is electrically connected to a power supply board 12.

In practical application, since the backlight drive system includes a plurality of power supply boards 12, it is convenient to dispose the power supply board 12 close to the backlight drive board 11, reduce the length of the power supply connection cable 121 between the power supply board 12 and the backlight drive board 11, and reduce the electromagnetic interference of the power supply connection cable 121 during the transmission of electrical signals, to improve the stability of the backlight drive system.

Specifically, the backlight drive board 11 adjacent to the power supply board 12 may be the backlight drive board 11 close to the power supply board 12. For example, as shown in FIG. 1, the backlight drive board 11 close to the power supply board 12 is the backlight drive board 11 at the upper left corner and the lower left corner. Therefore, the power supply board 12 may be electrically connected to the backlight drive board 11 at the upper left corner and lower left corner, to reduce the length of power supply connection cable 121 between the power supply board 12 and the backlight drive board 11, to reduce the electromagnetic interference of transmission of electrical signals by the power supply connection cable 121, and improve the stability of the backlight drive system.

Optionally, the backlight drive system may include 4 backlight drive boards 11 and 2 power supply boards 12 The 4 backlight drive board 11 may be disposed close to the four top vertex corners of the display screen 20, each power supply board 12 is electrically connected to two adjacent backlight drive boards 12, to reduce the length of power connection cable 121 between the power supply board 12 and the backlight drive board 11, and reduce the electromagnetic interference of transmission of electrical signals by the power supply connection cable 121.

It may be understood that in FIG. 1, it only shows the case of two power supply boards 12 control four backlight drive boards 11, but in practical application, the number of power supply board 12 may be disposed according to the specific number and position of backlight drive board 11, for example, the number of power supply board 12 may be three, five or six, etc. The specific number of power supply board 12 in the embodiment of the present disclosure may not be limited.

Specifically, the backlight drive system may also include: a transfer power supply board 13, and the transfer power supply board 13 is electrically connected to each power supply board 12, and it is configured to access voltage signals and control the power supply of a plurality of power supply boards 12.

In practical application, the power supply board 13 may be configured to convert the original alternating current (AC) to a plurality of outputs that may be used as an input to a plurality of power supply boards 12. In practical application, the power supply board 13 may be configured to convert the original AC to the AC required by the power supply board 12, and to filter the original AC.

In an embodiment of the present disclosure, a control board 10 may be electrically connected to each backlight drive board 11 by using an enabled signal cable 101 and a brightness signal cable 102. The enable signal cable 101 may be configured to transmit enabling control signals and brightness signal cable 102 may be configured to transmit adjustment signals.

Specifically, the enabling control signal may be an Enable (EN) signal, and the enabling control signal may be configured to control the turning on and turning off of a backlight unit. The brightness adjustment signal may be a pulse width modulation (PWM) and the brightness adjustment signal may be configured to adjust light and shade of the backlight unit.

Optionally, a control board 10 may be disposed between a plurality of backlight drive boards 11 so that the distance between the control board 10 and each backlight drive board 11 is close, thus, the length of the enabling control cable 101 and the brightness signal cable 102 between the control board 10 and each backlight drive board 11 may be close to each other, to improve the startup synchronization of the plurality of backlight drive boards 11, furthermore, the start synchronization of the backlight unit of the display device may be improved.

In practical application, since the backlight drive board 11 is disposed at the edge of the display screen 20, so that the control board 10 is disposed between a plurality of backlight drive boards 11 as follows: the control board 10 is disposed in the central area of the display screen 20. In order to make the distance between the control board 10 and each backlight drive board 11 relatively close.

Optionally, the control board 10 is electrically connected to each backlight drive board 11 by enabling signal cable 101 and the brightness signal cable 102 with equal length.

In practical application, in case that the control board 10 is electrically connected to each backlight drive board 11 by enabling signal cable 101 and the brightness signal cable 102 with equal length, the enabling control signal and the brightness adjustment signal output by the control board 10 may be received by each backlight drive board 11 at the same time, therefore the backlight drive boards 11 are controlled to start at the same time. As the backlight drive boards 11 are controlled to start at the same time, the backlight units are started at the same time, and the brightness adjustments to the backlight units may also be operated at the same time, thus, the display effect of the display device may be improved.

In an optional embodiment of the present disclosure, a control board 10 is electrically connected to a power supply board 12, in case that the control board 10 receives the power input from the power supply board 12, it outputs the enabling control signal and the brightness adjustment signal. The backlight drive board 11 starts working when it receives the power input, the enabling control signal and the brightness adjustment signal.

In practical application, in case that the backlight drive board 11 needs to be started, it is capable to control the power supply board 12 to supply power to the control board 10 and the backlight drive board 11 electrically connected to the power supply board 12 at the same time, the control board 10 may only receive power input from the power supply board 12 in order to output the enabling control signal and the brightness adjustment signal to the backlight drive board 11. Each backlight drive board 11 only receives the power input of the power supply board 12, and the enabling control signal of the control board 10, to start the brightness adjustment signal, thus, the start synchronization of the plurality of backlight drive boards 11 may be further improved.

It may be understood that FIG. 1 only shows the example that the control board 10 is adjacent and electrically connected to the power supply board 12. However, in practical application, the control board 10 may be electrically connected to any power supply board 12, which is, the control board 10 may also be electrically connected to other power supply boards 12, it is not limited in the embodiment of the present disclosure.

Specifically, the control board 10 may be a field programmable gate array (FPGA). As a semi-custom circuit in the application specific integrated circuit (ASIC) field, FPGA not only solves the shortcoming of custom circuit, but also overcomes the shortcoming of limited gate number of original programmable device.

In an optional embodiment of the present disclosure, a plurality of backlight drive boards 11 may be respectively disposed on either side of the display screen 20. For example, on the left and right sides of the display shown in FIG. 1. The plurality of power supply boards 12 may be disposed close to both sides of the display screen 20, and electrically connected to the backlight drive board 11 respectively to make the length of the power connection cable 121 between the power supply board 12 and the backlight drive board 11 as short as possible, to reduce the electromagnetic interference of the power connection cable 121, and improve the stability of power transmission.

In practical application, the backlight drive board 11 may be provided with a power interface, a control interface and a backlight interface. The power source interface may be configured to connect to the power supply connection cable 121 of the power supply board 12, and the control interface may be configured to connect to the enabling signal cable 101 and the brightness signal cable 102, and the backlight interface may be configured to connect with the backlight unit.

In summary, the backlight drive system of the embodiment of the present disclosure may at least include the following advantages:

In an embodiment of the present disclosure, since the backlight drive system includes a plurality of backlight drive boards, and the plurality of backlight drive boards are respectively disposed on the edge of the display screen, while the backlight unit is usually disposed on the edge or back of the display screen, so the distance between the backlight drive board and the backlight unit is short. Thus, the length of the backlight drive cable between the backlight drive board and the backlight unit may be shortened, the electromagnetic interference caused by the backlight drive cable during the signal transmission may be reduced, and the stability of the backlight drive system may be improved. Moreover, in the backlight drive system, a plurality of backlight drive boards may be configured to achieve the enabling control and brightness adjustment of the plurality of backlight units, by coordination and switch of the plurality of backlight drive boards, the display uniformity of the plurality of backlight units may be improved, and the electronic components on a single backlight drive board may be less, and the heat dissipating effect is better. Furthermore, the heat dissipating effect of the backlight drive system may be better.

An embodiment of the present disclosure also provides a display device, which may include a display screen, a plurality of backlight units and a foregoing backlight drive system; wherein the plurality of backlight drive boards in the backlight drive system are disposed on the edge of the display screen; the plurality of backlight drive boards and the plurality of backlight units are electrically connected by using the backlight drive cables.

In an embodiment of the present disclosure, since the backlight drive system includes a plurality of backlight drive boards, the plurality of backlight drive boards are respectively disposed on the edge of the display screen, while the backlight unit is usually disposed on the edge or back of the display screen, the distance between the backlight drive board and the backlight unit is short. Thus, the length of the backlight drive cable between the backlight drive board and the backlight unit may be shortened, the electromagnetic interference caused by the backlight drive cable in the signal transmission may be reduced, and the stability of the backlight drive system may be improved. Moreover, in the backlight drive system, throughout a plurality of backlight drive boards to achieve the enabling control of a plurality of backlight units and brightness adjustment, by coordination and switch of the plurality of backlight drive boards, the display uniformity of the plurality of backlight units may be improved, and the electronic components on a single backlight drive board may be less, and the heat dissipating effect is better. Furthermore, the heat dissipating effect of the backlight drive system may be better.

An embodiment of the present disclosure also provides a backlight drive board applied to the backlight drive system.

Figure 2:
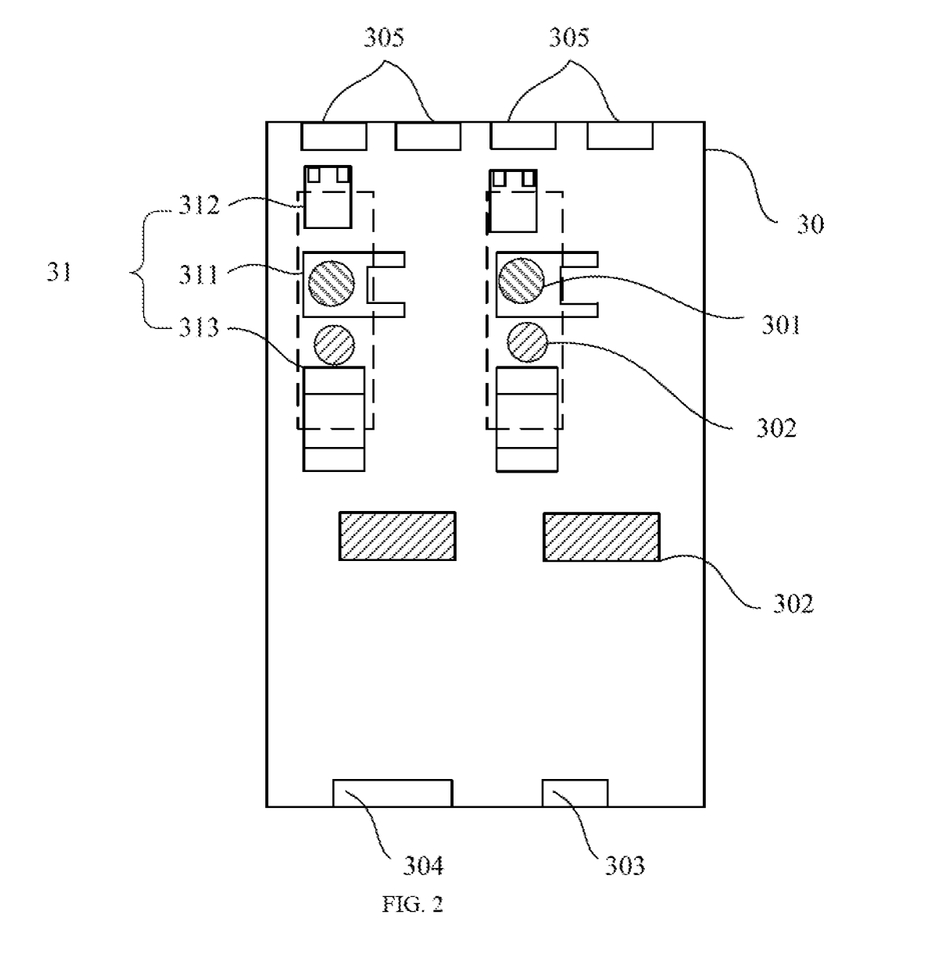
FIG. 2 illustrates a schematic diagram of a backlight drive board according to an embodiment of the present disclosure.

Referred to FIG. 2, a structural schematic diagram of a backlight drive board of the present disclosure is shown. As shown in FIG. 2. The backlight drive board may specifically include: a substrate 30 and a plurality of heating components 31, and the plurality of heating components 31 are disposed on the substrate 30, the substrate 30 is disposed with the heat dissipating layer opposite to the heating components 31, the plurality of heating components 31 are disposed in a straight line and plurality of heat dissipating layers are connected as an entirety.

In practical application, heat dissipating layer may be disposed on the substrate 30 in the position opposite to the heating components 31, and the heat dissipating layer may be configured to dissipate heat generated by the heating components 31. Specifically, the heat dissipating layer may be copper or other metallic layers, the specific material of the heat dissipating layer is not limited in the embodiment of the present disclosure.

In an embodiment of the present disclosure, since the plurality of heating components 31 are disposed in a straight line, the plurality of heat dissipating layers corresponding to the plurality of heating components 31 may be connected as an entirety, the area of the heat dissipating layer connected as an entirety may be larger, thus, it may achieve a better heat dissipating effect of the thermal conductivity layer.

Specifically, the heating components 31 may include at least one of the followings: a field effect tube 311, a diode 312, and an inductor 313, and the specific type of the embodiment of the present disclosure may not be limited. The field effect tube 311, the diode 312, and the inductor 313 may be connected in straight lines (dashed frames) so that their respective heat dissipating layers may be connected as an entirety.

In an embodiment of the present disclosure, the substrate 30 may include a first side and an opposite second side, the heating components 31 is disposed on the first side; The first aperture 301 is disposed on the first side to expose portion of the heat dissipating layer relative to the first aperture 301, to further improve the heat dissipating effect of the heat dissipating layer.

It should be noted that in practical application, the first aperture 301 may avoid the pin position of heating component 31 to avoid affecting the connection of heating component 31 on the heat dissipating layer.

Specifically, the size of the first aperture 301 may be disposed to a specific shape and size depends on the actual situation. For example, in the case of heating components 31 as the field effect tube, the shape and size of the first aperture 301 may be determined by referring to the size and shape of the pad of the field effect tube. The shape and the area of the first aperture 301 may be basically equal to the pad. Thus, the heating components 31 may effectively heat dissipate, and avoid power supply hazards caused by the exposure of the heat dissipating layer.

Optionally, a second aperture 302 may be disposed on the second side to expose the portion of the heat dissipating layer opposite to the second aperture 302, to further improve the heat dissipating effect of the heat dissipating layer.

In practical application, the second aperture 302 may be disposed in a position opposite to the heating components 31, or avoid the position of the heating components 31. The embodiment of the present disclosure may not limit the specific position of the second aperture 302.

It may be understood that in practical application, a skilled person in the art may dispose shapes of the first aperture 301 and the second aperture 302 according to the actual needs. For example, the shape of the first aperture 301 or the second aperture 302 may be a circle, a rectangle, or a polygon, etc. The embodiment of the present disclosure may not limit the specific shape of the first aperture 301 or the second aperture 302.

Optionally, the substrate is provided with at least two layers of ground layers, to further improve the heat dissipating effect of the backlight drive board.

In an embodiment of the present disclosure, the backlight drive board may achieve plater-level heat dissipating by using the heat dissipating layer on the substrate 10, the first aperture 301, the second aperture 302, and at least two conductive layers. Thus, the connecting port between the fan and a heat sink may be omitted on the substrate 30, and the area of the backlight drive board may be effectively reduced.

In practical application, the backlight drive board may also include: a power source interface 303, a control interface 304 and a backlight interface 305. The power source interface 303 may be connected to the power supply cable of the power supply board to input power supply; the control interface 304 may be connected to the enabling signal cable and the brightness signal cable of the control board to connect to the enabling control signal and the brightness adjustment signal; the backlight interface 305 may be connected to the backlight unit in the display device to output the backlight control signal to the backlight unit.

Optionally, the power source interface 303 and the control interface 304 may be disposed on the substrate 30 close to an end of the control board and the power supply board, so that the power source interface 303 may be connected to the power supply board, and the control interface 304 is connected with the control board. The backlight interface 305 may be disposed on the substrate 30 close to an end of the backlight unit to reduce the length of the backlight drive cable between the backlight interface 305 and the backlight unit as much as possible to improve the driving stability of the backlight unit.

In summary, the backlight drive board of the embodiment of the present disclosure may at least include the following advantages:

In an embodiment of the present disclosure, since the plurality of heating components are disposed in a straight line, the plurality of heat dissipating layers corresponding to the plurality of heating components may be connected as an entirety, the area of the heat dissipating layer connected as an entirety may be larger, thus, it may achieve a better heat dissipating effect of the thermal conductivity layer.

Finally, it should be noted that in this article, relation terms such as first and second class are used only to distinguish one entity or operation from another, and do not necessarily require or imply any such actual relationship or order between those entities or operations. Also, the term "including" and "include" or any of its other variants is intended to cover a non-exclusive contain, which includes a series of elements of the process, methods, objects, or terminal equipment includes not only those elements, but also no clear list of other elements, or also includes objects for the process, methods, or factors inherent to the terminal device. In the absence of further restrictions, the statement "including a . . . . A qualified element does not preclude the existence of another identical element in the process, method, article or terminal equipment that includes the element.

A backlight drive system, a display device and a backlight drive board provided by this disclosure are introduced in detail. In this paper, the principle and implementation of this disclosure are described in a specific case. The descriptions of the above embodiments are used only to help understand the method and the core ideas of this disclosure; At the same time, for the general technical personnel in the field, according to the idea of this disclosure, there will be changes in the specific implementation and application scope. To sum up, the contents of this specification should not be construed as restrictions on this disclosure.

The device described above example is only a schematic, wherein as separate components that unit may or may not be physically separated, as the unit display components may or may not be physical units, which may be located in one place, or it may be distributed to plurality of network unit. Some or all of the modules may be selected according to actual needs to achieve the purpose of this embodiment scheme. Ordinary technicians in this field may understand and implement it without any creative effort.

The term "one embodiment", "embodiment", or "one or more embodiments" herein means that a particular feature, structure, or feature described in combination with the embodiments is included in at least one of the embodiments disclosed. Also, note that the word examples here "in an embodiment" do not necessarily all refer to the same embodiment.

A great deal of detail is explained in the instructions provided here. It is understood, however, that the present disclosed embodiments may be practiced without these specific details. In some instances, publicly known methods, structures and techniques are not shown in detail so as not to obscure the understanding of this specification.

Any reference symbol between parentheses in a claim should not be construed as a limitation of the claim. The word "contain" does not exclude the presence of components or steps not listed in the claim. The word "one" or "one" before a component does not preclude the existence of plurality of such components. This disclosure may be achieved by means of hardware consisting of several different components and by means of a suitably programmed computer. In enumerating the unit claims of several devices, several of these devices may be embodied by the same hardware item. The use of words first, second, and third does not indicate any order. These words may be interpreted as names.

Finally, it should be noted that the above embodiments are used only to describe and not limit the technical proposal disclosed herein; Notwithstanding the detailed description of this disclosure by reference to the foregoing embodiments, ordinary technicians in the field should understand that they may modify the technical solutions recorded in each of the foregoing embodiments or substitute equivalently some of the technical features therein; Such modifications or substitutions shall not detract the essence of the corresponding technical solutions from the spirit and scope of the technical solutions of the embodiments disclosed herein.

The invention claimed is:

1. A backlight driving system, applied to a display device, wherein the display device comprises a display screen and a plurality of backlight units, and the backlight drive system comprises:

a control board and a plurality of backlight drive boards electrically connected to the control board, the plurality of backlight drive boards are disposed at an edge of the display screen, and the plurality of backlight drive boards are electrically connected to the plurality of back units; and the control board is configured to output an enabling control signal and a brightness adjustment signal to the plurality of backlight driving boards, to control the plurality of backlight driving boards to drive the plurality of backlight units, to achieve enabling control and brightness adjustment.

2. The backlight drive system according to claim 1, wherein the backlight drive system further comprises: a plurality of power supply boards, each of the plurality of power supply boards is electrically connected to at least one of adjacent plurality of back drive boards by using a power cable in order to supply power to the backlight drive boards, and each of the plurality of the backlight driving boards is electrically connected to one of the plurality of the power supply boards.

3. The backlight drive system according to claim 2, wherein the backlight drive system further comprises: a transfer power board, and the transfer power board is electrically connected to each of the plurality of power boards in order to access a voltage signal to control the power supply of the plurality of power supply boards.

4. The backlight drive system according to claim 2, wherein the control board is electrically connected to each of the plurality of backlight drive boards by using an enabling signal cable and a brightness signal cable, the enabling signal cable is configured to transmit enabling control signal, and the brightness signal cable is configured to transmit brightness adjustment signal;

wherein the control board is connected to the plurality of backlight drive boards with equal length of the enabling signal cable and the brightness signal cable.

5. The backlight drive system according to claim 4, wherein the control board is electrically connected to one of the plurality of power supply boards, in case that the control board receives power input of the power supply board, output the enabling control signal and the brightness adjustment signal; and the backlight drive board is started in the case of receiving the power supply input, the enabling control signal and the brightness adjustment signal.

6. The backlight drive system according to claim 4, wherein the plurality of backlight drive boards are disposed on both sides of the display screen, the plurality of power supply boards are disposed on both sides of the display screen, and electrically connected to the backlight drive board, respectively, and the control board is disposed in the central area of the display screen.

7. The backlight drive system according to claim 2, wherein the backlight drive system comprises four backlight drive boards and two power supply boards; wherein, the four backlight drive boards are respectively disposed close to four top corners of the display screen; and each one of the power supply boards are electrically connected to two adjacent backlight drive boards respectively.

8. The backlight drive system according to claim 1, wherein the backlight drive board is provided with a power source interface, a control interface and a backlight interface.

9. The backlight drive system according to claim 1, where in the control board is a field programmable gate array.

10. The backlight drive system according to claim 1, wherein the display device comprises a plurality of display screens, each of the plurality of display screens is provided with a plurality of backlight drive boards at the edge, and the control board of the backlight drive system is connected to the plurality of backlight drive boards of each of the plurality of display screens.

11. The backlight drive system according to claim 4, wherein to start the backlight drive board, the power supply board is controlled to output power to the control board and the backlight drive board connected to the power supply board at the same time, the control board does output the enabling control signal and the brightness adjustment signal to the backlight drive board until receiving input power of the power supply board, each of the backlight drive boards starts only when receiving the input power of the power supply board, the enabling control signal and the brightness adjustment signal of the control board.

12. A display device, wherein the display device comprises: a display screen, a plurality of backlight units and the backlight drive system according to claim 1; wherein, the plurality of backlight drive boards of the backlight drive system are disposed respectively at the edge of the display screen; and the plurality of backlight drive boards are electrically connected to the plurality of backlight units by the backlight drive cable.

13. A backlight drive board of the backlight drive system according to claim 1, wherein the backlight drive board comprises: a substrate and a plurality of heating components, the plurality of heating components are disposed on the substrate, the substrate is provided with a heat dissipating layer in a position relative to the heating components, the heating components are disposed in a straight cable and the plurality of heat dissipating layer are connected as an entirety.

14. The backlight drive board according to claim 13, wherein the substrate is provided with a first side and an opposite second side, the plurality of heat components are disposed on the first side; and the first side is provided with a first aperture, to expose the part of heat dissipating layer opposite to the first aperture.

15. The backlight drive board according to claim 14, wherein the second side is provided with a second aperture, to expose the part of heat dissipating layer opposite to the second aperture.

16. The backlight drive board according to claim 13, wherein the heat component comprises at least one of the followings: a field displacement effect transistor, a diode and an inductor.

17. The backlight drive board according to claim 13, wherein the substrate is provided with at least two layers of ground layers.

18. The backlight drive board according to claim 13, wherein the heat dissipating layer is made of copper or other metallic layers.

\* \* \* \* \*